United States Patent
Grutzeck et al.

(10) Patent No.: US 10,696,542 B2
(45) Date of Patent: Jun. 30, 2020

(54) MICROMECHANICAL COMPONENT AND METHOD FOR PRODUCING A MICROMECHANICAL COMPONENT

(71) Applicant: Robert Bosch GmbH, Stuttgart (DE)

(72) Inventors: Helmut Grutzeck, Kusterdingen (DE); Joerg Muchow, Reutlingen (DE); Johannes Baader, Freiburg (DE)

(73) Assignee: Robert Bosch GmbH, Stuttgart (DE)

( * ) Notice: Subject to any disclaimer, the term of this patent is extended or adjusted under 35 U.S.C. 154(b) by 150 days.

(21) Appl. No.: 15/785,514

(22) Filed: Oct. 17, 2017

(65) Prior Publication Data
US 2018/0105416 A1  Apr. 19, 2018

(30) Foreign Application Priority Data

Oct. 19, 2016 (DE) ........................ 10 2016 220 524

(51) Int. Cl.
*B81B 3/00* (2006.01)
*G02B 26/08* (2006.01)
*B81C 1/00* (2006.01)

(52) U.S. Cl.
CPC ........ *B81B 3/0051* (2013.01); *B81C 1/00103* (2013.01); *G02B 26/085* (2013.01); *G02B 26/0833* (2013.01); *B81B 2201/042* (2013.01); *B81B 2203/0163* (2013.01); *B81B 2203/0376* (2013.01)

(58) Field of Classification Search
None
See application file for complete search history.

(56) References Cited

U.S. PATENT DOCUMENTS

2009/0231671 A1*  9/2009  Yang ................... G02B 26/0841
                                                                    359/291
2017/0052363 A1*  2/2017  Straub ................. G02B 26/085

FOREIGN PATENT DOCUMENTS

DE         102014207891 A1    8/2015
WO         WO-2015121037 A1 *  8/2015  ........... G02B 26/085

* cited by examiner

*Primary Examiner* — Jennifer D. Carruth
(74) *Attorney, Agent, or Firm* — Norton Rose Fulbright US LLP; Gerard Messina

(57) ABSTRACT

A micromechanical component including a mounting support, a coil winding retained by a coil brace, and an adjustable part, the coil brace and the adjustable part being connected to each other and via at least one spring element with the mounting support in such a way that the adjustable part is adjustable relative to the mounting support about at least one axis of rotation, and a stop support being fixedly disposed or developed on the mounting support and being at least partially framed by the coil brace, which stop support has at least one first stop area protruding on a surface of the mounting support, which limits a relative movement at least of the coil brace in at least one direction relative to the mounting support by a contact of the at least one first stop area with the coil brace.

27 Claims, 5 Drawing Sheets

MICROMECHANICAL COMPONENT AND METHOD FOR PRODUCING A MICROMECHANICAL COMPONENT

CROSS REFERENCE

The present application claims the benefit under 35 U.S.C. § 119 of German Patent Application No. DE 102016220524.2 filed on Oct. 19, 2016, which is expressly incorporated herein by reference in its entirety.

FIELD

The present invention relates to a micromechanical component. The present invention also relates to a method for producing a micromechanical component.

BACKGROUND INFORMATION

German Patent Application No. DE 10 2014 207 891 A1 describes mirror systems, which respectively have a coil winding retained by a coil brace and a mirror connected to the coil brace, the coil brace and the connected mirror being respectively connected to a mounting support via four soft springs in such a way that the mirror is adjustable about an axis of rotation relative to the mounting support when the coil winding is supplied with current and an outer magnetic field is produced.

SUMMARY

The present invention provides a micromechanical component and a method for producing a micromechanical component.

The present invention improves a robustness, in particular a drop robustness, of micromechanical components, in that at least the at least one first stop area limits a relative movement at least of the coil brace relative to the mounting support in the event of a collision or drop of the micromechanical component equipped with the at least one first stop area. At least the at least one first stop area thus acts as a "stop element," which reduces a risk of damage by limiting the relative movement at least of the coil brace relative to the mounting support. The present invention thus contributes toward creating more robust micromechanical components, which are able to withstand greater force impacts and greater drop heights compared to the related art. Because of the robustness/drop robustness of a micromechanical component increased by the present invention, it is possible to use the micromechanical component, an actuator equipped with the micromechanical component or a sensor equipped with the micromechanical component in a more versatile manner.

In an advantageous specific embodiment of the micromechanical component, the at least one first stop area is shaped convexly. There is thus no need to fear an impact of the coil brace on an edge of the at least one convexly shaped first stop area (during a collision or drop of the micromechanical component equipped with it).

Preferably, at least one contact area of the coil brace associated with the at least one first stop area is shaped concavely. During a collision or drop of the respective micromechanical component, a corresponding relative movement at least of the coil brace relative to the mounting support is limited by a contact of the at least one first stop area with the associated contact area, a usual risk of breaks being reduced due to the curved designs of the at least one first stop area and of the at least one associated contact area and the consequently increased total contact area.

In another advantageous specific embodiment, the at least one first stop area is developed on at least one elastically bendable subsection of the stop support. A contact of the coil brace with the at least one first stop area thus results in an elastic deformation of the at least one associated elastically bendable subarea of the stop support, which makes it possible to absorb kinetic energy (drop energy). This may also be paraphrased by saying that it is possible to brake the (undesired) relative movement at least of the coil brake relative to the mounting support by way of the elastic deformation of the at least one elastically bendable subarea of the stop support.

Optionally, the at least one elastically bendable subarea of the stop support with the at least one first stop area respectively has a metal coating. The respective metal coating may have a damping effect in the event of a great load on the respective elastically deformable subarea of the stop support.

In one advantageous development of the micromechanical component, the mounting support includes a frame at least partially framing the coil brace including the coil winding, the adjustable part and/or at least one connecting component, via which the coil brace is connected with the adjustable part, at least one second stop area being developed on the frame, which protrudes on an inner surface of the frame, by which a relative movement at least of the coil brace, of the adjustable part and/or of the at least one connecting component is able to be limited in at least one direction relative to the mounting support by a contact of the at least one second stop area with the coil brace, the adjustable part and/or the at least one connecting component. The design of the at least one second stop area also contributes to the desired increase of the robustness/drop robustness in this specific embodiment of the micromechanical component.

In particular, it is also possible for a second stop area to be shaped convexly. In this case, at least one contact area of the coil brace, the adjustable part and/or the at least one connecting component associated with the at least one second stop area is preferably shaped concavely. This ensures that a contact of the at least one second stop area with the at least one associated contact area is developed over a comparatively large area, which reduces a usual risk of breaks.

The at least one second stop area is preferably developed on at least one elastically bendable subarea of the frame. It is thus possible to absorb kinetic energy (drop energy) by an elastic deformation of the at least one elastically bendable subarea of the frame. The design of the at least one second stop area on the at least one elastically bendable subarea of the frame thus also contributes toward damping an undesired relative movement of the coil brace, the adjustable part and/or the at least one connecting component relative to the mounting support.

In another advantageous specific embodiment of the micromechanical component, the at least one elastically bendable subarea of the frame with the at least one second stop area respectively has a metal coating. In this case too, the at least one metal coating of the at least one elastically bendable subarea of the frame having the at least one second stop area is able to contribute toward damping a load.

For example, the micromechanical component may be a micromirror having an adjustable mirror disk as the adjustable part. The micromechanical component is thus usable in a versatile manner. It should be noted, however, that embodiment of the micromechanical component is not limited to a micromirror.

The advantages described above are also realized in the implementation of a corresponding production method for a micromechanical component. It should be noted that the production method according to the specific embodiments of the micromechanical component described above may be developed further.

BRIEF DESCRIPTION OF THE DRAWINGS

Additional features and advantages of the present invention are explained below with reference to the figures.

DETAILED DESCRIPTION OF EXAMPLE EMBODIMENTS

Figure 1:
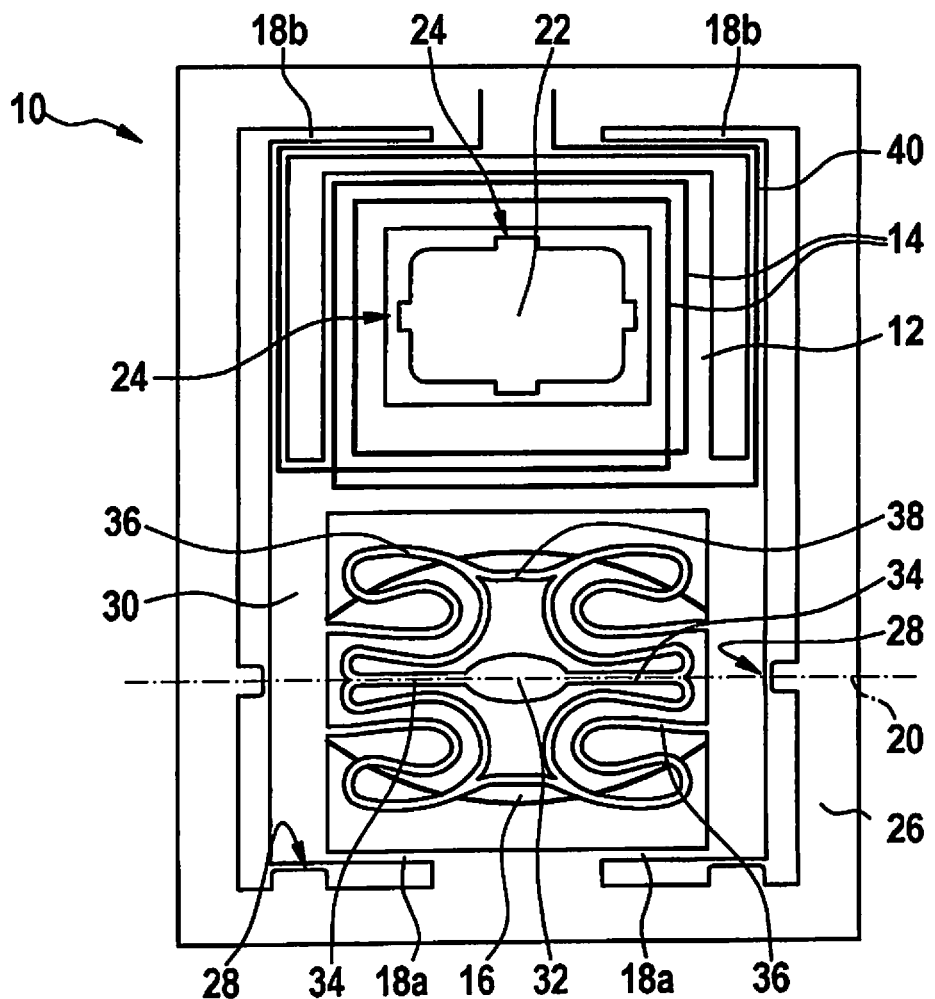
FIG. 1 shows a schematic representation of a first specific development of the micromechanical component.

FIG. 1 shows a schematic representation of a first specific development of the micromechanical component.

The micromechanical component schematically represented in FIG. 1 has at least one mounting support 10 (e.g., a housing), a coil winding 14 retained by a coil brace 12, and an adjustable part 16. Coil brace 12 and adjustable part 16 are connected to each other. Furthermore, coil brace 12 and adjustable part 16 are connected to mounting support 10 via at least one spring element 18a and 18b in such a way that adjustable part 16 is adjustable relative to mounting support 10 about at least one axis of rotation 20. In the specific embodiment of FIG. 1, the micromechanical component is by way of example a micromirror that has an adjustable mirror disk 16 as adjustable part 16. It should be noted, however, that such an embodiment of the micromechanical component is to be interpreted only in exemplary fashion.

The micromechanical component also has a stop support 22 that is arranged or developed in a fixed manner on mounting support 10. The fixed arrangement or development of stop support 22 on mounting support 10 is to be understood in such a way that a position or a setting of stop support 22 relative to a center of mass of mounting support 10 normally (when the micromechanical component is undamaged) remains unchanged during an operation of the micromechanical component. The position and setting of stop support 22 relative to the center of mass of mounting support 10 is modifiable only by way of damaging the micromechanical component. Stop support 22 may be referred to in particular as a part of mounting support 10.

Stop support 22 is at least partially framed by coil brace 12. In addition, stop support 22 is developed having at least one first stop area 24 protruding on a surface of stop support 22. The at least one first stop area 24 limits a relative movement at least of coil brace 12 in at least one direction (e.g., parallel to axis of rotation 20 or perpendicular to axis of rotation 20) relative to mounting support 10 by a contact of the at least one first stop area 24 with coil brace 12. If mounting support 10 experiences an impact for example (e.g. in the event the micromechanical component falls down), then the contact of the at least one first stop area 24 with coil brace 12 limits the relative movement at least of coil brace 12 relative to mounting support 10, which prevents above all an excessive bending of the at least one spring element 18a and 18b (due to an excessive relative movement at least of coil brace 12 relative to mounting support 10). Thus there is no danger of the at least one spring element 18a and 18b breaking due to an excessive load in the event of an impact on mounting support 10.

The development of stop support 22 having the at least one first stop area 24 thus increases the robustness, in particular the drop robustness, of the micromechanical component of FIG. 1. It is therefore possible to use the micromechanical component of FIG. 1 in a more versatile fashion during its operation. The micromechanical component also has the higher robustness while it is being produced, as soon as the stop support 22 having the at least one first stop area 24 is developed, so that it becomes possible to perform many production processes in a more risk-free manner such as for example a handling or a pick-and-place process.

As an advantageous development, mounting support 10 of the specific embodiment shown here also includes coil brace 12 (with coil winding 14), adjustable part 16 and/or at least one connection component 30, via which coil brace 12 is connected to adjustable part 16, at least partially framing frame 26. At least one second stop area 28 is developed on frame 26, which protrudes on an inner surface of frame 26. The at least one second stop area 28 is also able to limit/limits a relative movement at least of coil brace 12, adjustable part 16 and/or the at least one connecting component 30 in at least one direction (e.g., parallel to axis of rotation 20 or perpendicular to axis of rotation 20) relative to mounting support 10 by a contact of at least a second stop area 28 with coil brace 12, adjustable part 16 and/or the at least one connecting component 30. Thus the at least one second stop area 28 on frame 26 also reduces an acceleration path in the event that mounting support 10 is impacted or the micromechanical component drops. The development of the at least one second stop area 28 on frame 26 thus also contributes toward reducing a load on the at least one spring element 18a and 18b.

The micromechanical component of FIG. 1 has a U-shaped partial frame 30 as the at least one connecting component 30, with which coil brace 12 is formed in one piece. U-shaped partial frame 30 frames a base area 32, on which adjustable part 16 is anchored. Base area 32 is gimballed between two web elements 34 extending along axis of rotation 20. Each end of the two web elements 34 facing away from base area 32 is connected to U-shaped partial frame 30 via respectively two loop-shaped springs 36. Loop-shaped springs 36 are developed, by way of example, in mirror symmetry with respect to axis of rotation 20. In addition, the two loop-shaped springs 36 situated on the same side of axis of rotation 20 are connected to each other by respectively one connecting web 38. It should be noted, however, that the attachment of adjustable part 16 to U-shaped partial frame 30 represented schematically in FIG. 1 is to be interpreted only in exemplary fashion.

The development of the at least one spring element 18a and 18b of the micromechanical component of FIG. 1 is also to be understood in merely exemplary fashion. The micromechanical component has as the at least one spring element 18a and 18b respectively two first spring elements 18a and respectively two second spring elements 18b, which respectively connect U-shaped partial frame 30 to frame 26. First spring elements 18a are respectively web-shaped and run parallel to axis of rotation 20. First spring elements 18a are anchored at respectively one end on an open end of U-shaped partial frame 30 and at respectively another end on a projection of frame 26. Second spring elements 18b are angle springs and respectively frame coil brace 12 partially. Second spring elements 18b are anchored at respectively one end on an end of U-shaped partial frame 30 facing away from the open end and at respectively another end on a (further) projection of frame 26. The micromechanical component of FIG. 1 thus has relatively soft spring elements 18a and 18b, the development of which still allows for enough free space for developing the at least one second stop area 28 on frame 26. It is thus possible to develop the micromechanical component in a comparatively simple manner with a sufficient number of second stop areas 28. Furthermore, coil winding 14 is electrically connected to mounting support 10 via conductor tracks 40 that run on second spring elements 18b.

Figure 2:
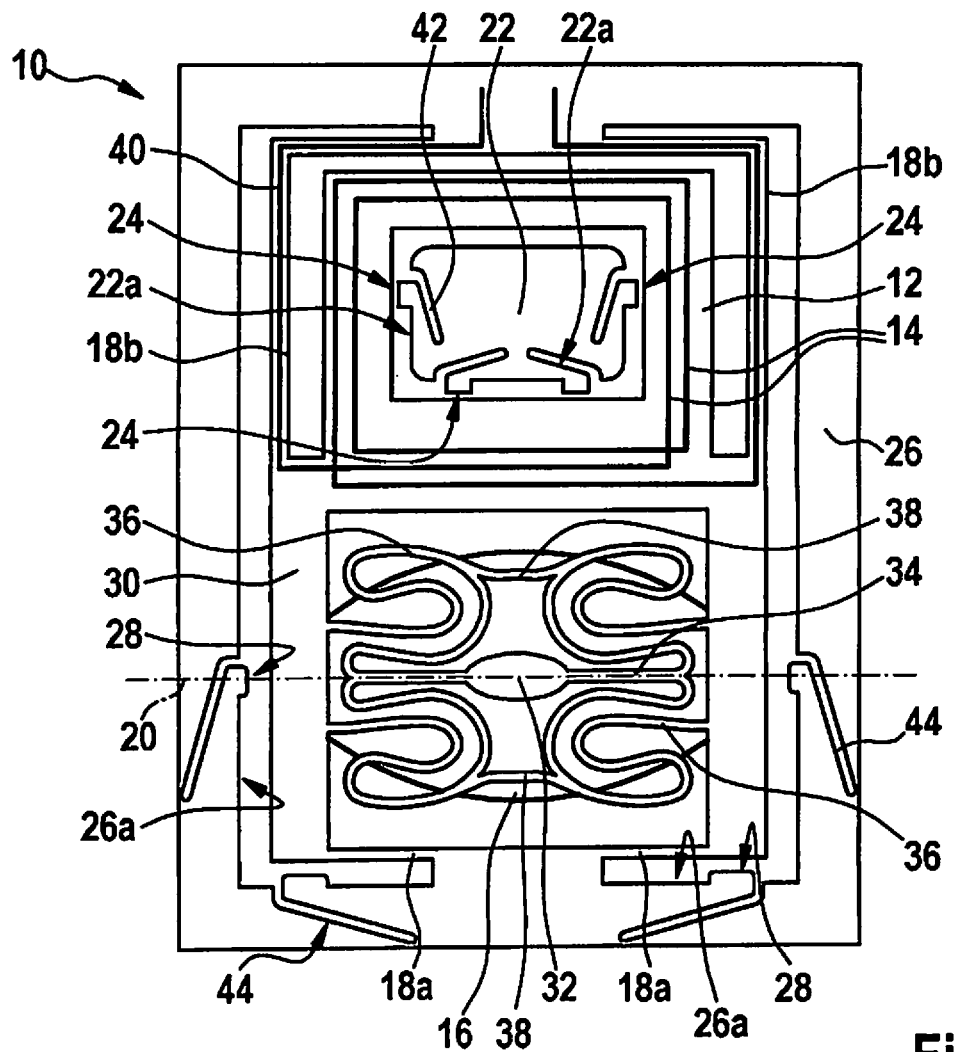
FIG. 2 shows a schematic representation of a second specific development of the micromechanical component.

FIG. 2 shows a schematic representation of a second specific development of the micromechanical component.

As an advantageous further development compared to the previously described specific embodiment, in the case of the micromechanical component of FIG. 2, the at least one first stop area 24 is developed on at least one elastically/flexibly bendable subarea 22a of stop support 22. For this purpose, for example, at least one separating trench 42 is structured into stop support 22 in such a way that the elastically bendable subarea 22a, which is "partially separated" by the at least one separating trench 42 from a remaining area of stop support 22, is able to be pressed against the remaining area in an elastically/flexible manner. This may also be described as a "springy design," "spring backing" and/or "cushioning" of the at least one first stop area 24. The at least one first stop area 24 may be referred to as a "springy stop area" 24. If coil brace 12 is pressed intensely against the at least one first stop area 24, kinetic energy may be absorbed by an elastic bending of the at least one associated elastically bendable subarea 22a. The development of the at least one elastically bendable subarea 22a with the at least one first stop area 24 thus reduces a local load on the micromechanical component in the event of a collision of mounting support 10 or of a drop of the micromechanical component. In the event of an acceleration of the micromechanical component parallel to axis of rotation 20 as well as perpendicular to axis of rotation 20 or at an angle of inclination between 0° and 90° (degree) with respect to axis of rotation 20, the elastically bendable subareas 22a of stop support 22 are able to contribute toward damping the local load.

As an optional development, in the micromechanical component of FIG. 2, the at least one second stop area 28 is also developed on at least one elastically/flexibly bendable subarea 26a of frame 26. This can also be achieved by structuring at least one separating trench 44 in frame 26. The "springy design," "spring backing" and/or "cushioning" of the at least one second stop area 28 bolsters the advantages described in the preceding paragraph. In the event of a (strong) pressure of stop support 12, adjustable part 16 and/or the at least one connecting component 30 against the at least one second stop area 28, it is possible to absorb kinetic energy by an elastic bending of the at least one associated elastically bendable subarea 26a. For this reason, it is also possible to refer to the at least one second stop area 28 respectively as "springy stop area" 28.

Figure 3:
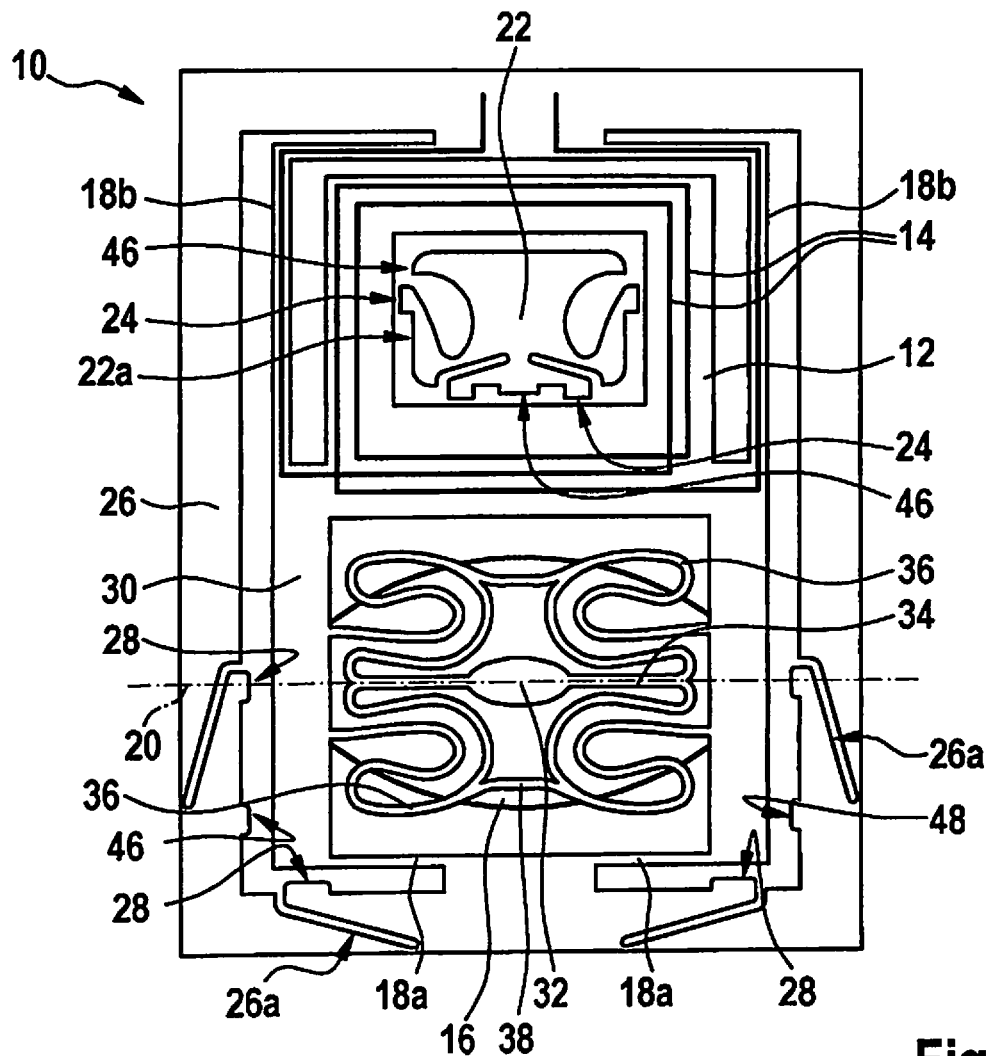
FIG. 3 shows a schematic representation of a third specific development of the micromechanical component.

FIG. 3 shows a schematic representation of a third specific embodiment of the micromechanical component.

The micromechanical component schematically represented in FIG. 3 is a development of the specific embodiment of FIG. 2. In order to prevent an excessive bending of the at least one elastically bendable subarea 22a of stop support 22, at least one first stopper 46 is developed adjacent to the at least one first stop area 24, which protrudes on a surrounding surface of stop support 22. A maximum height of the at least one first stopper 46, by which first stopper 46 protrudes from the surrounding surface of stop support 22, is below a maximum height of the adjacent first stop area 24 (by which first stop area 24 protrudes from a surrounding surface of stop support 22). In the event of a contact of first stop area 24 equipped with a first stopper 46 with an associated contact area of first coil brace 12, a portion of the kinetic energy is thus absorbed by the bending of associated elastically bendable subarea 22a, while the associated first stopper 46 prevents an excessive load on elastically bendable subarea 22a. The respective elastically bendable subarea 22a is thus reliably prevented from breaking.

An excessive bending of the at least one elastically bendable subarea 26a of frame 26 may also be prevented by at least one second stopper 48, which protrudes on a surrounding inner subarea of frame 26. The at least one second stopper 48 preferably protrudes by a maximum height from the surrounding inner subarea of frame 26, which is below a maximum height of the adjacent second stop area 28 (by which second stop area 28 protrudes from a surrounding inner subarea of frame 22). The at least one second stopper 48 thus prevents the at least one elastically bendable subarea 26a of frame 26 from breaking.

Figure 4:
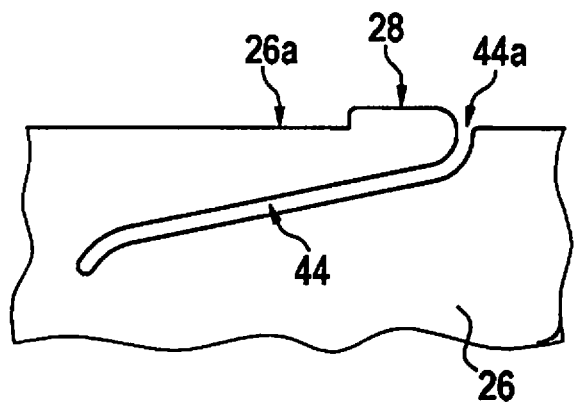
FIG. 4 shows a schematic partial representation of a fourth specific embodiment of the micromechanical component.

FIG. 4 shows a schematic partial representation of a fourth specific embodiment of the micromechanical component.

As shown schematically in FIG. 4, the at least one separating trench 42 or 44 may also be structured in such a way that a width of the respective elastically bendable subarea 22a or 26a of stop support 22 or of frame 26 increases exponentially along separating trench 42 or 44 starting from a mouth 44a of separating trench 42 or 44. A transition of elastically bendable subarea 22a or 26a to stop support 22 or frame 26 is thus designed to be curved. This reduces a stress load on the transition in an elastic deformation of the respective elastically bendable subarea 22a or 26a and thus prevents it from breaking.

Regarding further features of the micromechanical component of FIG. 4, reference is made to the previously described specific embodiments.

Figure 5:
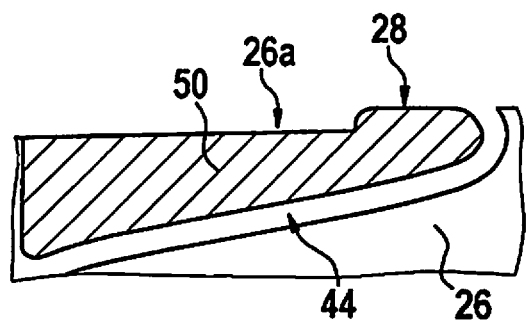
FIG. 5 shows a schematic partial representation of a fifth specific embodiment of the micromechanical component.

FIG. 5 shows a schematic partial representation of a fifth specific embodiment of the micromechanical component.

In the specific embodiment schematically represented in FIG. 5, the at least one elastically bendable subarea 22a (not shown) of stop support 22 with the at least one first stop area 24 respectively has a metal coating. FIG. 5 shows only a (further) metal coating 50, which is applied to the at least one elastically bendable subarea 26a of frame 26 with the at least one second stop area 28. The respective metal coating 50 of the at least one elastically bendable subarea 22a and 26a of stop support 22 and/or of frame 26 is preferably made of at least one ductile metal (such as copper and/or aluminum for example). The respective metal coating 50 of the at least one elastically bendable subarea 22a and 26a of stop support 22 and/or of frame 26 contributes toward damping a load on the respective elastically deformable subarea 22a or 26a of stop support 22 or of frame 26. In particular, the respective metal coating 50 of the at least one elastically bendable subarea 22a and 26a of stop support 22 and/or of frame 26 dampens a high frequency oscillation of the respective elastically bendable subarea 22a or 26a of stop support 22 or of frame 26 (even under heavy load). The respective metal coating 50 is thus able to prevent in particular an extremely fast impact of the respective stop area 24 or 28 of stop support 22 and/or of frame 26 against the associated contact area of coil brace 12, of adjustable part 16 and/or of the at least one connecting component 30, which prevents breaks.

Regarding further features of the micromechanical component of FIG. 5, reference is made to the previously described specific embodiments.

Figure 6:
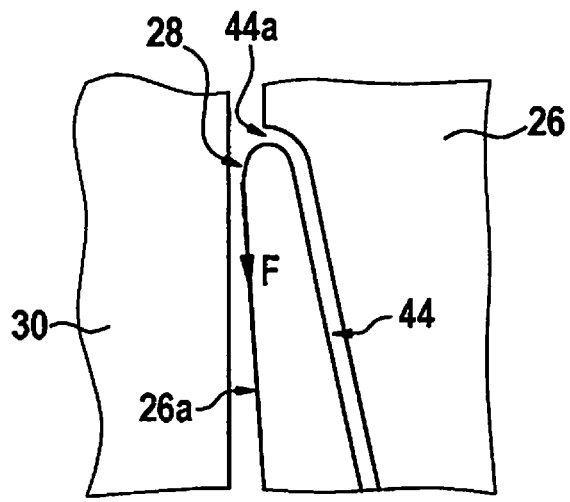
FIG. 6 shows a schematic partial representation of a sixth specific embodiment of the micromechanical component.

FIG. 6 shows a schematic partial representation of a sixth specific embodiment of the micromechanical component.

In the micromechanical component of FIG. 6, the at least one first stop area 24 (not shown) is shaped convexly. It may be seen that also the at least one second stop area 28 is shaped convexly.

Advantageously, the at least one convexly shaped first stop area 24 has a sharply curved shape on a side facing a mouth of adjacent separating trench 42, while the same first stop area 24 has a less sharply curved (flattened) shape on a side facing away from the mouth of adjacent separating trench 42. A surface area F of a contact surface of the respective first stop area 24 with coil brace 12 (when the respective first stop area 24 makes contact with coil brace 12) thus increases with increasing deflection of coil brace 12 (or increasing bending of the associated elastically bendable subarea 22a of stop support 22). This may also be described as an "adaptation" of the associated elastically bendable subarea 22a of stop support 22 with increasing deflection of coil brace 12. A "flexible length" of the respective elastically deformable subarea 22a of stop support 22 is thus reduced with increasing deflection of coil brace 12, which accordingly increases a spring force (counteracting the bending of the associated elastically bendable subarea 22a of stop support 22). This is advantageous especially in intense drop loads.

It is also possible for the at least one convexly shaped second stop area 28 to have a strongly curved shape on a side facing a mouth 44a of adjacent separating trench 44, while the same second stop area 28 is developed having a less curved shape (flattened) on a side facing away from mouth 44a of adjacent separating trench 44. Such a design of the at least one second stop area 28 is also advantageous in intense drop loads.

Figure 7:
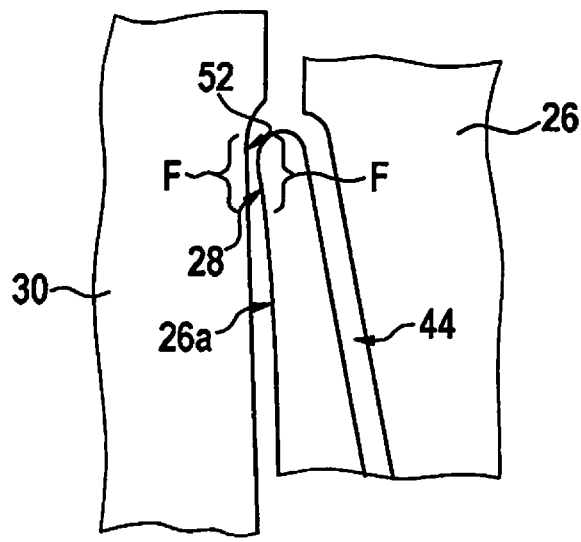
FIG. 7 shows a schematic partial representation of a seventh specific embodiment of the micromechanical component.

FIG. 7 shows a schematic partial representation of a seventh specific embodiment of the micromechanical component.

In addition to the at least one convexly shaped first stop area 24, in the micromechanical component of FIG. 7, at least one contact area (not shown) of coil brace 12, which is associated with the at least one first stop area 24, is also concavely shaped. (The at least one contact area of coil brace 12 may be understood as a subarea of coil brace 12, which touches the associated first stop area 24 in the event of a contact of the associated first stop area 24 with coil brace 12.) A surface area F of a contact area of the respective convexly shaped first stop area 24 with the associated concavely shaped contact area is therefore comparatively large when the respective first stop area 24 makes contact with coil brace 12.

Additionally, at least one contact area 52, associated with the at least one second stop area 28, of coil brace 12, adjustable part 16 and/or the at least one connecting component 30 is also concavely shaped (in a manner matching the at least one convexly shaped second stop area 28). (The at least one contact area of coil brace 12, of adjustable part 16 and/or of the at least one connecting component 30 may be understood as a subarea of coil brace 12, of adjustable part 16 and/or of the at least one connecting component 30, which touches the associated second stop area 28 in the event that the associated second stop area 28 contacts coil brace 12, adjustable part 16 and/or the at least one connecting component 30.) In this case too, a surface area F of a contact area of the respective convexly shaped second stop area 28 with the associated concavely shaped contact area 52 is comparatively large when the respective second stop area 28 makes contact with the coil brace 12, the adjustable part 16 and/or the at least one connecting component 30.

Due to increased surface areas of the contact areas, the risks of a locally limited impact contact are avoided in the micromechanical component of FIG. 7. There is thus no reason to fear a risk that the components 12, 16, 22, 26 and 30 break or split upon making contact. This is also the case when the components 12, 16, 22, 26 and 30 brought into contact are made of a comparatively brittle material such as silicon, for example.

In all of the micromechanical components described above, component parts 12, 18a, 18b, 22, 24, 26, 28, 30, 32, 34, 36 and 38 may be structured from a semiconductor layer. The semiconductor layer used for this purpose may be formed on an insulating layer, which covers a carrier substrate (not shown). Mounting support 10 may be formed e.g. at least from frame 26 and the carrier substrate. In addition, mounting support 10 may also have a cap/encapsulation (not sketched), which is bonded to frame 26. The cap/encapsulation may be bonded onesidedly (only on the side of mounting support 10/frame 26) or twosidedly (on two opposite sides of mounting support 10/frame 26). Optionally, the cap/encapsulation may also have an optical "window" for incoming or outgoing electromagnetic radiation. Frame 26, however, may also be installed in a device via another housing or a package.

The above-described micromechanical components may be used advantageously in mobile devices. They may be used, for example, for micromirrors, in particular for mirror deflection systems or image projectors, or for sensors such as, for example, rotation sensors or acceleration sensors.

In all of the above-described micromechanical components, it is possible to adjust the respective adjustable part 16 about axis of rotation 20 by applying current to coil winding 14 and by effecting an outer magnetic field quasi-statically or resonantly. In this manner, it is possible, for example, to deflect a light or laser beam in a wide area. Because the techniques for applying current to coil winding 14 and for effecting the outer magnetic field are conventional, no further details are discussed here.

It should also be noted that the features of the specific embodiments described above may be combined with one another. It is thus possible that a respective micromechanical component also has features of various specific embodiments.

Figure 8:
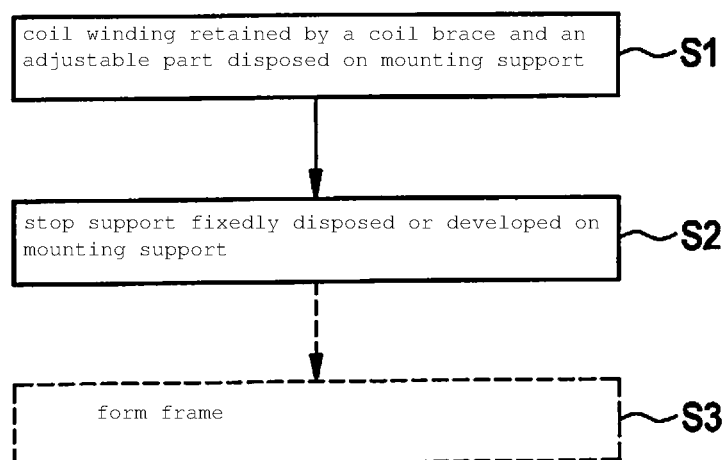
FIG. 8 shows a flow chart to explain a specific embodiment of the production method for a micromechanical component.

FIG. 8 shows a flow chart for explaining a specific embodiment of the method for producing a micromechanical component.

The production method described here may be implemented, for example, for producing the above-described micromechanical components. It should be noted, however, that an implementation of the production method is not limited to producing the above-described micromechanical components.

In a method step S1, a coil winding retained by a coil brace and an adjustable part are disposed on a mounting support in such a way that the coil brace and the adjustable part are connected to one another and via at least one spring element to the mounting support. For this purpose, it is ensured that the adjustable part is adjustable relative to the mounting support about at least one axis of rotation.

In a method step S2, the stop support is fixedly disposed or developed on the mounting support, the stop support being developed as having at least one first stop area protruding on a surface of the stop support. In addition, the stop support is framed at least partially by the coil brace so that by way of the stop support having the at least one protruding first stop area a relative movement at least of the coil brace in at least one direction relative to the mounting support is limited by a contact of the at least one first stop area with the coil brace. The production method described here thereby also achieves the advantages explained above.

The method steps S1 and S2 may be performed in any order, simultaneously or overlapping in time. Optionally, the production method also has a method step S3, in which a frame is formed (as part of the mounting support), which at least partially frames the coil brace with the coil winding, the adjustable part and/or at least one connecting component, via which the coil brace is connected with the adjustable part, and which is developed as having at least one second stop area protruding on an inner surface of the frame. This ensures that the frame having the at least one protruding second stop area is able to limit a relative movement at least of the coil brace, the adjustable part and/or the at least one connecting component in at least one direction relative to the mounting support by a contact of the at least one second stop area with the coil brace, the adjustable part and/or the at least one connecting component.

The at least one first and/or second stop may be easily developed by a trench method performed for structuring a semiconductor layer. For this purpose, it is possible to use a semiconductor layer formed on an insulating layer, which covers a carrier substrate (not shown). The at least one first and/or second stop may be developed as having the above-described forms, "springy design" and metal coating of all specific embodiments of micromechanical components described above.

What is claimed is:

1. A micromechanical component, comprising:
a mounting support;
a coil winding retained by a coil brace;
an adjustable part, the coil brace and the adjustable part being connected to each other and via at least one spring element to the mounting support in such a way that the adjustable part is adjustable relative to the mounting support about at least one axis of rotation; and
a stop support which is developed as at least one layer of material on the mounting support and is at least partially framed by the coil brace, the stop support having a fixed position relative to the mounting support during operation of the micromechanical component, and which has at least one first stop area protruding on a surface of the stop support, which limits a relative movement at least of the coil brace in at least one direction relative to the mounting support via an impact of the at least one first stop area with the coil brace, the at least one direction being parallel to the at least one axis of rotation.

2. The micromechanical component as recited in claim 1, wherein the at least one first stop area is shaped convexly.

3. The micromechanical component as recited in claim 2, wherein at least one contact area of the coil brace associated with the at least one first stop area is shaped concavely.

4. The micromechanical component as recited in claim 1, wherein the at least one layer of material includes a semiconductor layer.

5. The micromechanical component as recited in claim 1, wherein the at least one first stop area is developed on a subarea of the stop support that is at least partially separated from a remaining area of the stop support by a separating trench.

6. A micromechanical component, comprising:
a mounting support;
a coil winding retained by a coil brace;
an adjustable part, the coil brace and the adjustable part being connected to each other and via at least one spring element to the mounting support in such a way that the adjustable part is adjustable relative to the mounting support about at least one axis of rotation; and
a stop support which is fixedly disposed or developed on the mounting support and is at least partially framed by the coil brace, and which has at least one first stop area protruding on a surface of the stop support, which limits a relative movement at least of the coil brace in at least one direction relative to the mounting support by a contact of the at least one first stop area with the coil brace, wherein the at least one first stop area is developed on at least one elastically bendable subarea of the stop support.

7. The micromechanical component as recited in claim 6, wherein the at least one elastically bendable subarea of the stop support having the at least one stop area respectively has a metal coating.

8. The micromechanical component as recited in claim 6, wherein the at least one first stop area is developed on a subarea of the stop support that is at least partially separated from a remaining area of the stop support by a separating trench.

9. A micromechanical component, comprising:
a mounting support;
a coil winding retained by a coil brace;
an adjustable part, the coil brace and the adjustable part being connected to each other and via at least one spring element to the mounting support in such a way that the adjustable part is adjustable relative to the mounting support about at least one axis of rotation; and
a stop support which is fixedly disposed or developed on the mounting support and is at least partially framed by the coil brace, and which has at least one first stop area protruding on a surface of the stop support, which limits a relative movement at least of the coil brace in at least one direction relative to the mounting support by a contact of the at least one first stop area with the coil brace,
wherein the mounting support includes a frame that at least partially frames the coil brace with at least one of the coil winding, the adjustable part and at least one connecting component, via which the coil brace is connected with the adjustable part, and wherein at least one second stop area protruding on an inner surface of the frame is on the frame, which is able to limit a relative movement at least of one of the coil brace, the adjustable part and the at least one connecting component, in at least one direction relative to the mounting support by a contact of the at least one second stop area with at least one of the coil brace, the adjustable part, and the at least one connecting component.

10. The micromechanical component as recited in claim 9, wherein the at least one second stop area is shaped convexly.

11. The micromechanical component as recited in claim 10, wherein at least one of: (i) at least one contact area of the coil brace, (ii) the adjustable part, and (iii) the at least one connecting component associated with the at least one second stop area, is shaped concavely.

12. The micromechanical component as recited in claim 9, wherein the at least one second stop area is on at least one elastically bendable subarea of the frame.

13. The micromechanical component as recited in claim 12, wherein the at least one elastically bendable subarea of the frame having the at least one second stop area respectively has a metal coating.

14. The micromechanical component as recited in claim 1, wherein the micromechanical component is a micromirror having an adjustable mirror disk as the adjustable part.

15. A method for producing a micromechanical component, comprising:
disposing a coil winding retained by a coil brace and an adjustable part on a mounting support, the coil brace and the adjustable part being connected to each other and via at least one spring element with the mounting support in such a way that the adjustable part is adjustable relative to the mounting support about at least on axis of rotation; and
forming a stop support as at least one layer of material on the mounting support and at least one first stop area protruding on a surface of the stop support, the stop support being formed to have a fixed position relative to the mounting support during operation of the micromechanical component, the stop support being at least partially framed by the coil brace and which limits a relative movement at least of the coil brace in at least one direction relative to the mounting support via an impact of the at least one first stop area with the coil brace, the at least one direction being parallel to the at least one axis of rotation.

16. The method as recited in claim 15, wherein the mounting support includes a frame that at least partially frames the coil brace with at least one of the coil winding, the adjustable part and at least one connecting component, via which the coil brace is connected with the adjustable part, and wherein at least one second stop area protruding on an inner surface of the frame is on the frame, which is able to limit a relative movement at least of one of the coil brace, the adjustable part and the at least one connecting component, in at least one direction relative to the mounting support by a contact of the at least one second stop area with at least one of the coil brace, the adjustable part, and the at least one connecting component.

17. The method as recited in claim 16, wherein the at least one second stop area is shaped convexly.

18. The method as recited in claim 17, wherein at least one of: (i) at least one contact area of the coil brace, (ii) the adjustable part, and (iii) the at least one connecting component associated with the at least one second stop area, is shaped concavely.

19. The method as recited in claim 16, wherein the at least one second stop area is on at least one elastically bendable subarea of the frame.

20. The method as recited in claim 19, wherein the at least one elastically bendable subarea of the frame having the at least one second stop area respectively has a metal coating.

21. The method as recited in claim 15, wherein the micromechanical component is a micromirror having an adjustable mirror disk as the adjustable part.

22. The method as recited in claim 15, wherein the at least one layer of material includes a semiconductor layer.

23. The method as recited in claim 15, wherein the at least one first stop area is developed on a subarea of the stop support that is at least partially separated from a remaining area of the stop support by a separating trench.

24. A method for producing a micromechanical component, comprising:
disposing a coil winding retained by a coil brace and an adjustable part on a mounting support, the coil brace and the adjustable part being connected to each other and via at least one spring element with the mounting support in such a way that the adjustable part is adjustable relative to the mounting support about at least on axis of rotation; and
forming a stop support as at least one layer of material on the mounting support including at least one first stop area protruding on a surface of the stop support, which is at least partially framed by the coil brace and which limits a relative movement at least of the coil brace in at least one direction relative to the mounting support by a contact of the at least one first stop area with the coil brace, wherein the at least one first stop area is developed on at least one elastically bendable subarea of the stop support.

25. The method as recited in claim 24, wherein the at least one elastically bendable subarea of the stop support having the at least one stop area respectively has a metal coating.

26. A micromechanical component, comprising:
a mounting support;
a coil winding retained by a coil brace; and
an adjustable part, the coil brace and the adjustable part being connected to each other and via at least one spring element to the mounting support in such a way that the adjustable part is adjustable relative to the mounting support about at least one axis of rotation;
wherein the mounting support includes a frame that at least partially frames the coil brace with at least one of the coil winding, the adjustable part and at least one connecting component, via which the coil brace is connected with the adjustable part, and wherein at least one stop area protruding on an inner surface of the frame is on the frame, which is able to limit a relative movement at least of one of the coil brace, the adjustable part and the at least one connecting component, in at least one direction relative to the mounting support by a contact of the at least one second stop area with at least one of the coil brace, the adjustable part, and the at least one connecting component, wherein the at least one first stop area is developed on at least one elastically bendable subarea of the frame.

27. The micromechanical component as recited in claim 26, wherein the at least one first stop area is developed on a subarea of the stop support that is at least partially separated from a remaining area of the stop support by a separating trench.

* * * * *